United States Patent [19]
Taniguchi et al.

[11] Patent Number: 5,274,741
[45] Date of Patent: Dec. 28, 1993

[54] SPEECH CODING APPARATUS FOR SEPARATELY PROCESSING DIVIDED SIGNAL VECTORS

[75] Inventors: Tomohiko Taniguchi, Yokohama; Yoshinori Tanaka, Kawasaki; Yasuji Ota, Yokohama; Fumio Amano, Tokyo; Shigeyuki Unagami, Atsugi, all of Japan

[73] Assignee: Fujitsu Limited, Kawasaki, Japan

[21] Appl. No.: 515,430

[22] Filed: Apr. 27, 1990

[30] Foreign Application Priority Data

Apr. 28, 1989 [JP] Japan .................................. 1-107339

[51] Int. Cl.$^5$ .............................................. G10L 9/02
[52] U.S. Cl. ................................................ 395/2.31
[58] Field of Search ...................... 381/29, 40, 381/41, 43, 395/2, 2.31

[56] References Cited

U.S. PATENT DOCUMENTS

| | | | |
|---|---|---|---|
| 4,817,157 | 3/1989 | Gerson .................... | 381/40 |
| 4,868,867 | 9/1989 | Davidson et al. ........ | 381/31 |
| 5,086,471 | 2/1992 | Tanaka et al. ........... | 381/36 |

FOREIGN PATENT DOCUMENTS

| | | |
|---|---|---|
| 0125423 | 3/1984 | European Pat. Off. . |
| 53-147406 | 12/1978 | Japan . |
| 58-204632 | 11/1983 | Japan . |
| 60-237500 | 11/1985 | Japan . |
| 61-62100 | 3/1986 | Japan . |
| 61-220000 | 9/1986 | Japan . |
| 62-133498 | 6/1987 | Japan . |
| 2113055 | 12/1982 | United Kingdom . |
| 2117608 | 2/1983 | United Kingdom . |

OTHER PUBLICATIONS

Burton et al., "Isolated-Word Speech Recognition Using Multisection Vector Quantization Codebooks", Aug. 1985, pp. 837-849, IEEE Transactions on Acoustics, Speech and Signal Processing.
Copperi et al., "CELP Coding for High-Quality Speech at 8 kbit/s", IEEE, 1986, pp. 1685-1688.
European Search Report completed Aug. 10, 1990 by Examiner Berger at Vienna.
Sharad Singhal "On Encoding Filter Parameters for Stochastic Coders" pp. 1633-1636 1987 IEEE.
M. R. Schroeder & B. S. Atal "Code-Excited Linear Prediction (CELP) High-Quality Speech at Very Low Bit Rates" pp. 937-940 1985 IEEE.

Primary Examiner—Michael R. Fleming
Assistant Examiner—Michelle Doerrler
Attorney, Agent, or Firm—Staas & Halsey

[57] ABSTRACT

A speech coding apparatus includes multipliers and prediction filters which successively process a plurality of signal vectors obtained from an index $2^M$ and dimension N code book to obtain a reproduced speech signal. Error detectors are provided which find the error between the input speech signal and reproduced speech signal. Evaluators are also provided which calculate the optimum signal vectors giving the smallest errors. The multipliers are connected to a reduced code book, which is constituted of n number of code book blocks of index $2^{M/n}$ and dimension N/n (where n is an integer of two or more). There are n number of multipliers, n number of prediction filters, n number of error detectors, and n number of evaluators corresponding to the code book blocks.

7 Claims, 8 Drawing Sheets

SPEECH CODING APPARATUS FOR SEPARATELY PROCESSING DIVIDED SIGNAL VECTORS

CROSS-REFERENCE TO RELATED APPLICATION

The subject application is related to U.S. Ser. No. 07/580,669.

BACKGROUND OF THE INVENTION

Field of the Invention

The present invention relates to a speech coding apparatus for digitalized speech signals, more particularly, relates to a speech coding apparatus which operates under the vector quantization control method.

In the usual digital speech transmission system, analog speech signals are sampled at a sampling frequency of 8 kHz, converted to digitalized input speech signals of 8 bits every one sampling, and transmitted at a speed of 64 kbps. Various types of compression means have been proposed for reducing this transmission rate (64 kbps). For example, there is known the gain (magnitude) shape (phase) vector quantization method which can reduce the rate to 8 kbps or 4 kbps or so.

The above-mentioned gain shape vector quantization method is extremely effective as a high quality speech coding method and may be expected to be utilized for the following systems:

1) Intracompany digital communication systems,
2) Digital mobile radio communication systems (car telephones),
3) Speech information storing and answering systems.

In systems such as the above using the high quality speech coding method, it is necessary that the hardware be made as small in size as possible and that the quality of the speech reproduced on the receiver side not be allowed to deteriorate.

Description of the Related Art

One of the important constituent elements provided in one often seen conventional speech coding apparatus, which will be explained in detail later, is a code book made of a memory. This code book has an extremely large required memory capacity and, for example, accommodates $2^{16}$ (=65536) patterns of signal vectors.

This conventional apparatus further has a multiplier unit, a prediction filter unit, and an evaluation unit as key constituent elements. The multiplier unit must perform multiplying processing on the signal vectors corresponding to the $2^{16}$ patterns from the code book and the prediction filter unit must perform reproduction processing of speech signals on the results of the multiplying processing of that massive number. Further, the evaluation unit must calculate the error power of the error between the vast number of the reproduced speech signals and the input speech signals. Therefore, the multiplier unit, the prediction filter unit, and the evaluation unit have very large amounts of operations to execute. In addition to this, in the previously mentioned intracompany digital communication systems and digital mobile radio communication systems, real time processing is essential, so parallel processing inevitably becomes necessary. Due to the parallel processing, the hardware becomes massive in construction. This presents a first problem. This first problem naturally has the defect of making the speech coding apparatus high in price.

To resolve this first problem, it may be easily considered to use a simplified measure, explained in detail later, wherein the dimension (number of sampling values) of the signal vectors in the code book is reduced to half. According to this simplified measure, however, while the size of the hardware can be reduced, conversely the quality of the speech reproduced at the receiving side remarkably deteriorates. This presents a second problem.

SUMMARY OF THE INVENTION

Therefore, the present invention has as its object, in consideration of the above-mentioned first and second problems, the provision of a speech coding apparatus which can allow a small size hardware construction without causing deterioration of the quality of the speech reproduced at the receiver side.

To achieve the above object, the present invention connects the multiplier unit to a reduced code book, which is a reduced version of the original code book which can store a signal vector group of a size of $2^M \times N$ with an index $2^M$ and a dimension N. That is, the reduced code book is constituted by n number of code book blocks which are each constituted by an index $2^{M/n}$ and dimension N/n, where n is an integer of two or more, and which have mutually different indexes and mutually different dimensions and store a $2^{M/n} \times N/n$ size divided signal vector group.

Further, the multiplier unit is constituted of n number of multipliers which are connected to n number of code book blocks. The prediction filter unit is constituted by n number of prediction filters provided corresponding to the n number of multipliers. The error detection unit which detects errors is constituted of n number of error detectors which are provided corresponding to the n number of prediction filters and which output n number of outputs. The evaluation unit is constituted by n number of evaluators which receive the n number of errors as inputs and find the corresponding divided signal vectors giving the smallest errors from the code book blocks.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the related art and the disadvantages therein will be described with reference to the related figures.

Figure 1:
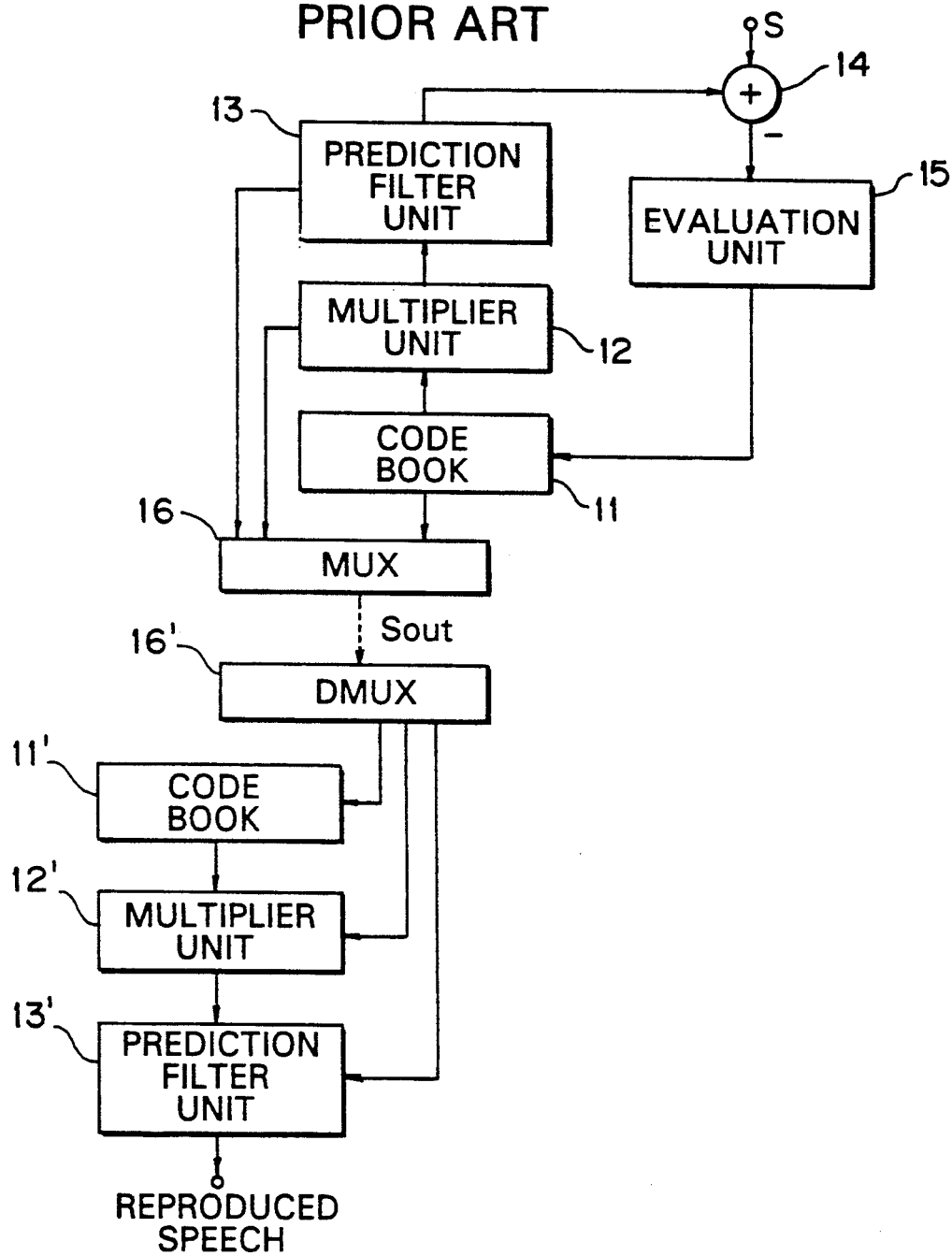
FIG. 1 is a block diagram showing a conventional speech coding apparatus operating under the vector quantization method and its receiver side.

FIG. 1 is a block diagram showing a conventional speech coding apparatus operating under the vector quantization method and its receiver side. In the speech coding apparatus (left half of FIG. 1), signal vectors are successively read out from the code book 11, these are multiplied by a gain at the multiplier unit 12, a speech signal is reproduced by the prediction filter unit 13, the reproduced speech signal and input speech signal are applied to the error detection unit 14, and the error between these signals is given to the evaluation unit 15. In the evaluation unit 15, determination is made of the index (shape) of the signal vector giving the smallest error power. This shape information (phase component), the gain information (magnitude component), and filter coefficient information given from the outside are multiplexed in a multiplexer unit 16 and transmitted to the receiver side as a coded output signal $S_{out}$.

At the receiver side (right half of FIG. 1), the shape information, the gain information, and the filter coefficient information are separated from the multiplexed signal received from the speech coding apparatus on the transmitter side. The signal vector read out from the code book 11' in accordance with the shape information is multiplied with a gain in accordance with the above-mentioned gain information in the multiplier unit 12' and a speech signal is reproduced through a prediction filter unit 13' set with the filter coefficient.

Figure 2:
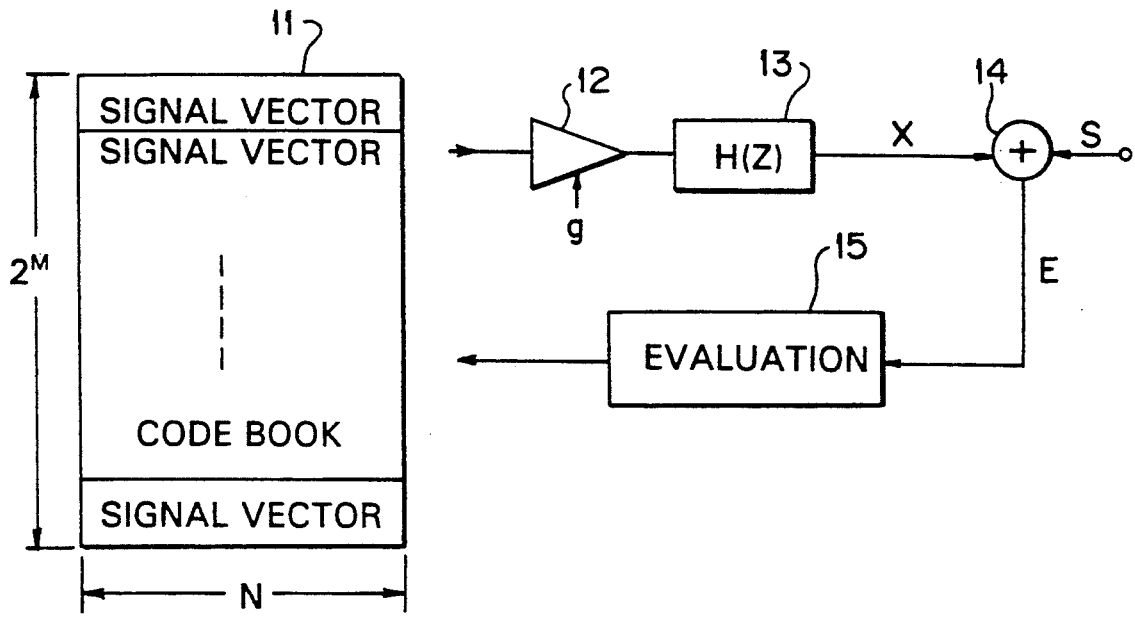
FIG. 2 is a block diagram showing important parts in the speech coding apparatus shown in FIG. 1.

FIG. 2 is a block diagram showing important parts in the speech coding apparatus shown in FIG. 1. Note that throughout the figures, similar constituent elements are given the same reference numerals or symbols. As illustrated, the original code book 11 is constituted of $2^M \times N$ vector spaces with an index $2^M$ and dimension N. The dimension N means N number of sample values. N is, for example, 40. That is, the code book 11 generally has an $N=40$ and $M=16$ construction of a memory capacity for storing a dimension N of signal vectors in $2^M$ patterns. Therefore, the required memory capacity is of 2.6M words. Further, if the gain in the multiplier unit 12 is g, the transfer function of the prediction filter unit 13 is H, the reproduced speech signal prepared by the signal vectors is X, the input speech signal is S, the error is E, the signal vector is C, and the index i is 1, 2, 3, .. . $2^M$, the evaluation unit 15 calculates the power of the error E, that is, $$|E(i)|^2 = [S - X(i)]^2 \quad (1)$$

evaluates the error power, and determines the index (shape) of the signal vector C giving the minimum $|E(i)|^2$. In this case, the reproduced speech signal X is expressed by $$X(i) = H[g \times C(i)] \quad (2)$$

The multiplying processing in the multiplier unit 12, the filter processing in the prediction filter unit 13, the error power calculation processing (equation (1)) in the evaluation unit 15, and the comparison processing for finding the smallest value of $|E(i)|^2$ may be realized by the operation functions of a digital signal processor (DSP) or the like. Further, when the amount of the operations is extremely large, it is possible to use a multiprocessor structure using a plurality of digital signal processors.

As mentioned above, by coding the input speech signal S separated into the magnitude component (gain) and the phase component (index), it is possible to realize high quality coding.

In the conventional example shown in FIG. 2, as mentioned earlier, the required memory capacity for constructing the code book 11 becomes extremely large and the amount of operations for $2^{16} (=65536)$ patterns (index of $2^{16}$) of signal vectors becomes extremely large, requiring multiplying processing in the multiplier unit 12, reproducing processing in the prediction filter unit 113, and calculation of the error power. Further, as mentioned earlier, real time processing is necessary, so use is made of parallel processing and other constructions and there is the problem that the hardware becomes extremely large and high in price.

Therefore, to reduce the amount of operations and the required memory capacity, the simplified measure is known of making the dimension N of the signal vector 20, or one half of the former case. Even if the hardware can be reduced by this simplified measure, there is the problem that the quality of the reproduced speech at the receiver side is remarkably deteriorated.

That is, as shown in the related art, if the dimension N of the signal vector C is made 40 (number of sampling values in one sub-frame), the number of patterns of the signal vector C is $2^{16}$, the amount of the gain information g is 6 bit/5 ms (one sub-frame = 5 ms), and the amount of shape information is 6 bit/5 ms, the gain information becomes 1.2 kbps and the shape information 3.2 kbps, so the total of the same becomes 4.4 kbps.

As opposed to this, according to the above simplified measure, the dimension N of the signal vector is made 20, or one half of the previous case, and the gain information becomes 6 bit/2.5 ms (one sub-frame = 2.5 ms), so the gain information becomes 2.4 kbps. Therefore, to fit the information in 4.4 kbps of data transmission, the shape information has to be 2.0 kbps, so the amount of the shape information becomes 5 bit/2.5 ms. This means that the number of patterns of the signal vectors becomes $2^5 = 32$ and the memory capacity may be made very smaller. Along with this, however, the types of the shape information become fewer, so the quality of the reproduced speech at the receiver side remarkably deteriorates. In the end, if one simply reduces the dimension N, while it may be possible to reduce the hardware, there is the unavoidable problem of deterioration of the quality of the reproduced speech.

The present invention attempts to reduce the amount of operations and the memory capacity without deterioration of the quality of the reproduced speech.

Figure 3A:
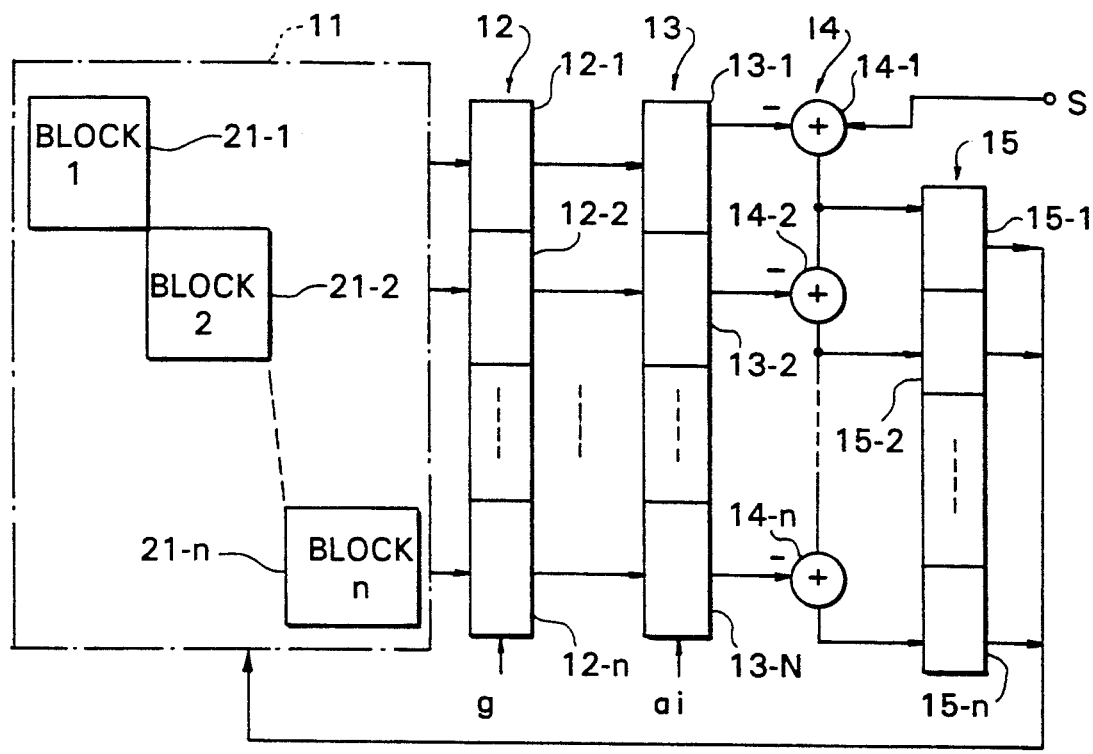
FIG. 3A is a block diagram showing the main constitution of the present invention.
Figure 3B:
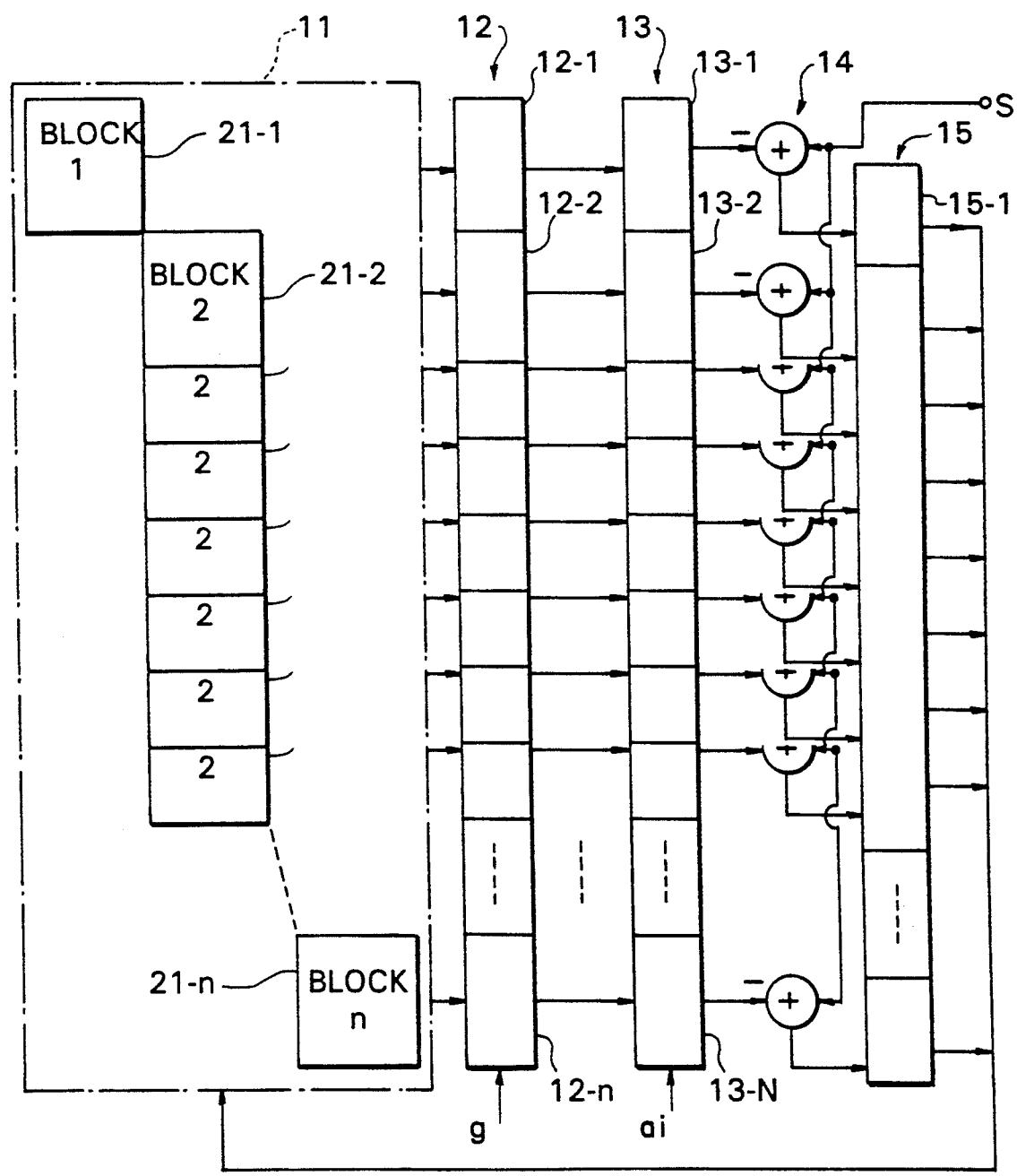
FIG. 3B is a block diagram showing the main constitution of a modification of the present invention.

FIG. 3A is a block diagram showing the main constitution of the present invention. FIG. 3B is a block diagram showing the main constitution of a modification of the present invention. The speech coding apparatus operated under the vector quantization method based on the present invention (FIG. 3A and FIG. 3B) does not cause any deterioration of the quality of the reproduced speech at the receiver side even though it reduces the dimension N of the signal vectors.

First, the present invention is provided with a code book 11 which is constituted of a plurality of code book blocks 21-1, 21-2, . . . 21-n which store divided signal vectors, multipliers 12-1, 12-2, . . . 12-n which multiply the divided signal vectors read out from the code book blocks 21-1, 21-2, ... 21-n by the same gain, prediction filters 13-1, 13-2, ... 13-n which receive the multiplied outputs from the multipliers, error detectors 14-1, 14-2, ... 14-n which find the error of the output signals from the prediction filters with respect to the input speech signal S, and evaluators 15-1, 15-2, ... 15-n which find the shape information of the divided signal vectors giving the minimum errors from the error detectors, wherein use is made of the shape information of a first (head) divided signal vector to find the shape information of the next divided signal vector, this operation is repeated successively, and the same gain information is allocated to a plurality of shape information. This is explained in more detail as follows:

If the dimension of the code book 11 is made N, the code book blocks 21-111, 21-2, ... 21-n hold a dimension N/n of divided signal vectors. Further, if the number of patterns (index) of the original code book 11 is made $2^M$, the code book blocks 21-1, 21-2, ... 21-n store $2^{M/n}$ patterns of divided signal vectors.

"○"'s are added to the dimension N/n divided signal vectors read out from the code book blocks 21-1, 21-2, ... 21-n to form the dimension N of signal vectors, these are multiplied by the respective gains g at the multipliers 12-1, 12-2, ... 12-n, are subjected to filter processing at the prediction filters 13-1, 13-2, ... 13-n to reproduce the speech signals (x), the errors with respect to the input speech signals are found at the error detectors 14-1, 14-2, ... 14-n, and the shape information giving the smallest error powers are found at the evaluators 15-1, 15-2, ... 15-n.

At this time, the shape information giving the smallest error powers between the speech signals (x) corresponding to the order N/n reproduced based on the divided signal vectors successively read out from the code book block 21-1 and the input speech signals corresponding to the reproduced speech signals (x) is found, this shape information is fixed, and the shape information giving the smallest error powers between the speech signals reproduced based on the divided signal vectors successively read out from the next code book block 21-2 and the input speech signals corresponding to the reproduced speech signals is found. Similarly, the shape information giving the smallest error powers between the speech signals corresponding to the dimension N/n reproduced based on the divided signal vectors successively read out from the code book block 21-n and the input speech signals corresponding to this reproduced speech signals is found. During this period, the gains multiplied at the multipliers 12-1, 12-2, ... 12-n are made the same value for the code book blocks 21-1, 21-2, ... 21-n. Therefore, a single gain information is allocated with respect to a plurality of shape information, so it is possible to maintain the original amount of gain information and the amount of shape information as they are and it is possible to prevent deterioration of the quality of the reproduced speech signal at the receiver side.

Below, embodiments of the present invention will be explained in detail with reference to the drawings.

Figure 4:
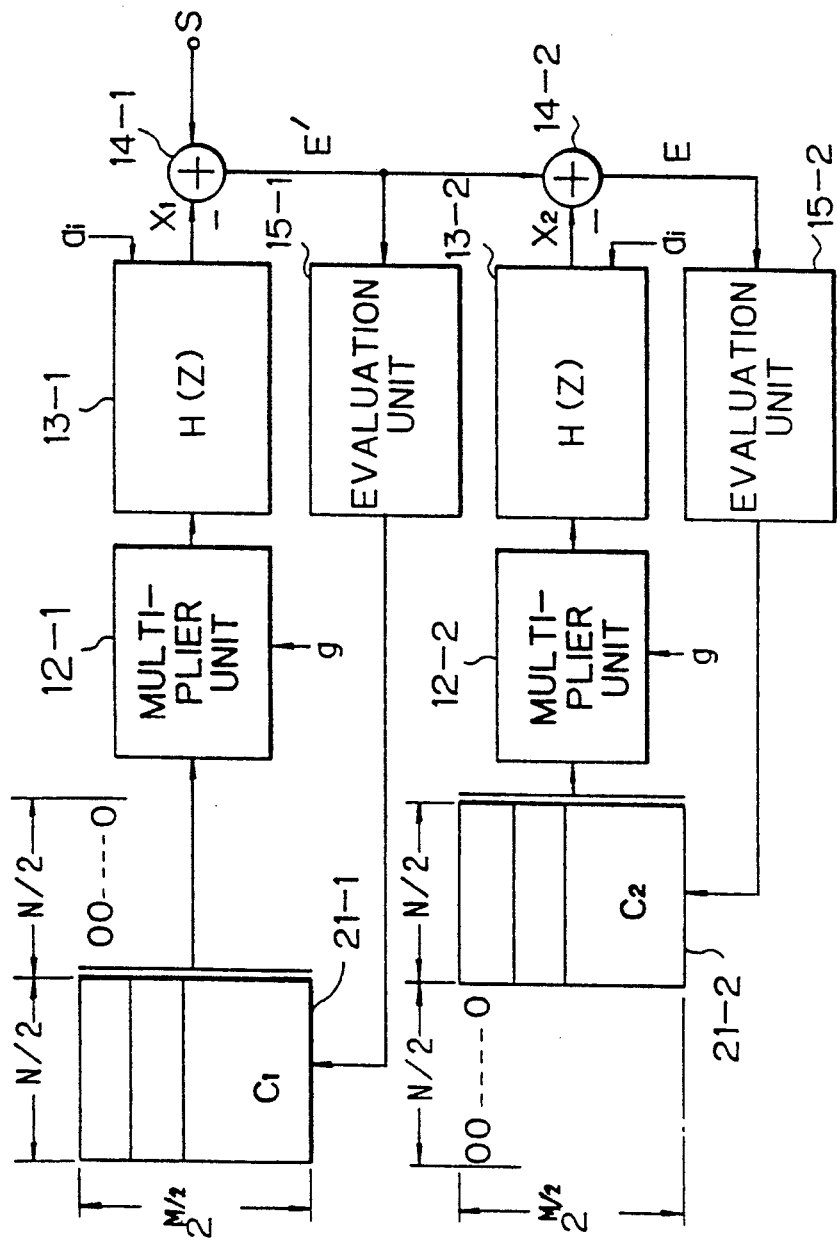
FIG. 4 is a block diagram showing an embodiment of the present invention.

FIG. 4 is a block diagram showing an embodiment of the present invention. This is based on the above-mentioned FIG. 3A. In this embodiment, the case is shown where the above-mentioned n is the most practical 2, but envisioning the case where n is 3 or more, the speech coding apparatus of the embodiment of the present invention may be described as follows:

When a first divided signal vector giving a first smallest error is specified at a first evaluator, the first error is fixed and, in that state, a second divided signal vector giving a second smallest error obtained by adding the first error to a second error detector is specified, the second error at that time is fixed and, in that state, a third divided signal vector giving a third smallest error obtained by adding the second error to a third error detector is specified by a third evaluator, and a similar operation is repeated for each of the code book blocks of the fourth block on.

Next, an explanation will be made of the case of n=2 referring to FIG. 4. FIG. 4 shows the case of allocation of a single gain information to the two groups of shape information. In the figure, 21-1 and 21-2 are code book blocks, 12-1 and 12-2 are multipliers, 13-1 and 13-2 are prediction filters, 14-1 and 14-2 are error detectors, and 15-1 and 15-2 are evaluators.

The code book blocks 21-1 and 21-2 have memory capacities enabling storage of $2^{M/2}$ patterns (index) of divided signal vectors, with a dimension N/2. Therefore, the required memory capacity of the code book constituted by the code book blocks 21-1 and 21-2 becomes $$[(N/2) \cdot 2^{M/2}] \times 2 = N \cdot 2^{M/2}$$

If N is 40 and M is 16, the conventional example would have required a memory capacity of 2.6 M words, but in the embodiment, a memory capacity of 10K words, 1/256th of this, is sufficient.

At the back stage of the dimension N/2 divided signal vectors successively read out from the code book block 21-1, as illustrated, is added "○"'s corresponding to the dimension N/2. Also, at the front stage of the dimension N/2 divided signal vectors successively read out from the code book block 21-2, as illustrated, is added "○" corresponding to the dimension N/2. These are applied to the multipliers 12-1 and 12-2, respectively, then multiplied with the gains g and given to the prediction filters 13-1 and 13-2, whereby a dimension N of reproduced speech signals $X_1$ and $X_2$ corresponding to the code book blocks 21-1 and 21-2 are obtained.

At the error detector 14-1 the error between the input speech signal S and the reproduced speech signal X is found and the error E' is evaluated at the evaluator 15-1. Further, at the error detector 14-2, the error between the error E' and the reproduced speech signal $X_2$ is found and the error E is evaluated at the evaluator 15-2.

In general, the divided signal vectors $C_1$ and $C_2$ successively read out from the code book blocks 11-1 and 11-2 are multiplied by the gain g then subjected to filter processing under the transfer function H to reproduce the speech signals. The error with respect to the input speech signal S is found and evaluated, then the divided signal vector index (shape) giving the smallest error power is determined. The error power in this case may be found by the following:

$$|E(i,j)|^2 = [S - X_1(i) - X_2(j)]^2 \qquad (3)$$

Note that $i = 1, 2 \ldots 2^{M/2}$; $j = 1, 2 \ldots 2^{M/2}$ (where j is the index of the code book block 21-2), and $$X_1(i) = H[g \cdot C_1(i)] \qquad (4)$$

$$X_2(j) = H[g \cdot C_2(j)] \qquad (5)$$

The amount of operations in the case of use of this technique becomes the same as the amount of operations of the conventional example explained with reference to FIG. 2 since there are $2^{M/2} \times 2^{M/2} = 2^M$ combinations of i and j.

In the present invention, the error power is evaluated through a plurality of stages. In the embodiment of FIG. 4, it is performed through two stages. That is, the error E' between the input speech signal S and the reproduced speech signal $X_1$ at the error detector 14-1 is applied to the evaluator 15-1, which evaluator 15-1 evaluates the error power of $$|E'(i)|^2 = [S - X_1(i)]^2 \tag{6}$$

determines the index (shape) of the divided signal vector giving the smallest error power, fixes the divided signal vector of that determined index, and outputs a reproduced speech signal $X_1$ from the prediction filter 13-1. The error detector 14-2 finds the error E between the reproduced speech signal $X_2$ of the output of the prediction filter 13-2 and the error E' at the output of the error detector 14-1, and applies it to the evaluator 15-2. The evaluator 15-2 evaluates the error power of $$|E(j)|^2 = [S - X_1 - X_2(j)]^2 \tag{7}$$

and determines the index (shape) of the divided signal vector giving the smallest error power. In this case, the gains g of the multipliers 12-1 and 12-2 are the same, so a single gain information is allocated to two groups of shape information. The shape information and the gain information, as explained with reference to FIG. 1 are multiplexed with the filter coefficients of the prediction filters 13-1 and 13-2 by the multiplexer 16 of FIG. 1 and sent to the receiver side.

The number of operations becomes a number corresponding to the number of patterns (index) of the code book blocks, and the number of patterns (index) of the two code book blocks 21-1 and 21-2 is $2^{(M/2)}$, so $2^{(M/2)+1}$ ($= 2^{M/2} \times 2$) operations is enough.

Further, in the embodiment of FIG. 4, if the amount of the gain information is made 6 bit/5 ms (one subframe = 5 ms), the amount of information transmitted becomes 1.2 kbps. If, as mentioned earlier, the total of the gain information and the shape information is 4.4 kbps, then the shape information may be made 3.2 (=4.4−1.2) kbps, so the amount of the shape information becomes 8 bit/2.5 ms and the code book blocks 21-1 and 21-2 can store $2^8$ (256) divided signal vector patterns. Therefore, by maintaining the ratio of the gain information and the shape information the same as in the conventional example, it is possible to prevent deterioration of the quality of the reproduced signal at the receiver side.

The required memory capacity of the code book blocks 21-1 and 21-2 becomes 5120 words, and two code book blocks 21-1 and 21-2 constitute a code book, so the memory capacity of the code book becomes 10240 words, which is 1/256th of the 2.6M word memory capacity of the conventional example.

Further, the amount of the operations corresponds to the number of patterns (index) of the divided signal vectors of the code book blocks 21-1 and 21-2, so is $2^{16} = 65536$ in the conventional example and $2^{8+1} = 512$ in the embodiment, or 1/128th of the conventional example.

In the embodiment of FIG. 4, the case is shown where two code book blocks 21-1 and 21-2 constitute the code book, but it is also possible to use more code book blocks. In this case, as mentioned earlier, in FIG. 4, the error detectors given the output of the prediction filters of the different stages are connected successively in series and the outputs of the error detectors are evaluated by the evaluators.

Figure 5:
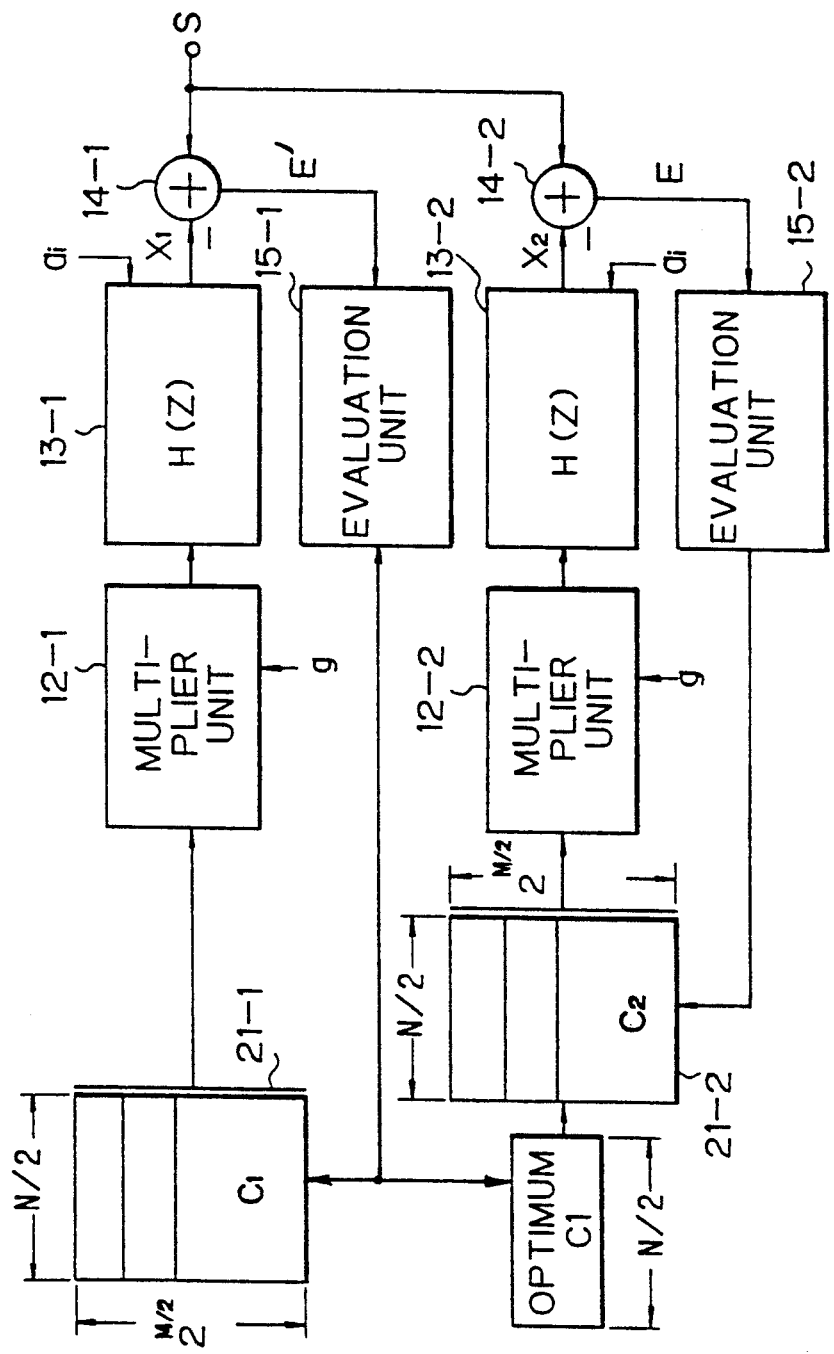
FIG. 5 is a block diagram showing a modified embodiment of the present invention.

FIG. 5 is a block diagram showing a modified embodiment of the present invention and is based on the previously mentioned FIG. 3B. In this embodiment, further, the case is shown of the most practical value of n, that is, 2, but if one envisions that n generally is 3 or more, the speech coding apparatus according to this embodiment of the present invention can be expressed as follows: That is, a first divided signal vector giving a first smallest error, specified by a first evaluator, is added to a second code book block; using the first divided signal vector as a fixed input, the second evaluator specifies a second divided signal vector giving a second smallest error; using the specified first divided signal vector and second divided signal vector as fixed inputs, a third evaluator specifies a third divided signal vector giving a third smallest error; and this operation is repeated for the fourth and later code book blocks.

In the same way as the above-mentioned embodiment (FIG. 4), the same gain g is given to all of the n number of multipliers (12). This gain g is given from the evaluator unit (15). Further, the filter coefficient $a_i$ given to the prediction filter (13) from the outside is generated by a known linear predictive analysis unit (not shown), for example. This linear predictive analysis unit receives the digitalized input speech signal S and performs linear prediction on the same to extract the linear predictive filter coefficient.

In FIG. 5, when the first evaluator 15-1 specifies the optimum signal vector $C_1$ giving the minimum error E', the optimum signal vector $C_1$ is added to the second code book block 21-2 and the second evaluator 15-2 specifies the optimum signal vector $C_2$ giving the smallest error E. The addresses of the code book blocks 21-1 and 21-2 corresponding to the optimum signal vectors $C_1$ and $C_2$ are multiplexed together with g and $a_i$ and transmitted to a speech decoding apparatus of the receiver side.

Figure 6:
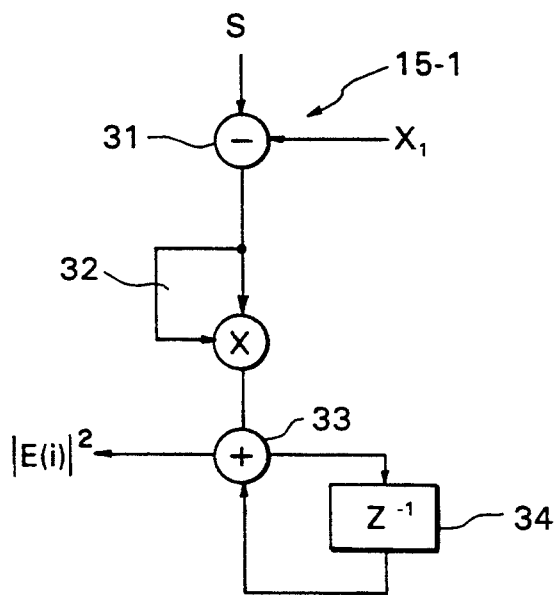
FIG. 6 is a specific view of key portions of the evaluation unit.

FIG. 6 is a specific view of key portions of the evaluation unit and shows in particular the evaluator 15-1. The other evaluators 15-2 etc. are exactly the same in construction.

The input speech signal S and the reproduced speech signal $X_1$ are input to a subtractor and the error of the two is squared at a multiplier 32. The squared value is added at an adder 33 with the one previous squared value, in the case of use of previous sampling values, delayed by a delay element 34 so as to find the above-mentioned $|E(i)|^2$. That is, the squared value is cumulatively added while changing the order N to 1, 2, 3, ... N.

The above cumulative addition is successively performed for each index and $|E(1)|^2$, $|E(2)|^2$, ... $|E(2^{M/2})|^2$ are found. Of these, the one index giving the smallest value (1, 2 ... $2^{M/2}$) is specified.

Note that the evaluator 15-1 in addition to the above performs an operation for calculating the above-mentioned gain g to be multiplied with the optimum signal vector $C_1$ corresponding to the selected index and an operation for scanning the code book block 21-1 in the order of the addresses.

Figure 7:
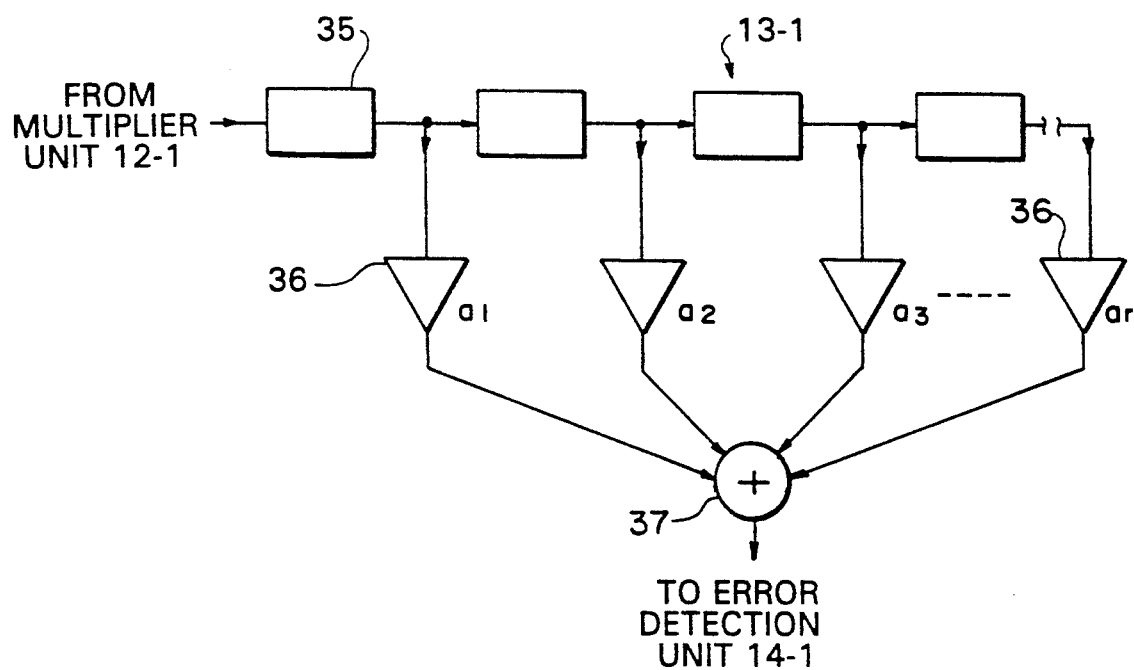
FIG. 7 is a specific view of the prediction filter unit.

FIG. 7 is a specific view of the prediction filter unit and shows as an example the prediction filter 13-1. This has exactly the same construction as the other prediction filter 13-2 etc. As clear from the figure, the prediction filter has the same basic construction as the known digital filter. That is, it is constituted of a plurality of delay elements, a plurality of multipliers 36 which weight the outputs from the delay elements, and an adder 37 which combines the outputs from the multipliers. The coefficients for determining the above weighting are the $a_1, a_2, \ldots a_r$ in the figure, that is, the afore-mentioned filter coefficient $a_i$.

Figure 8:
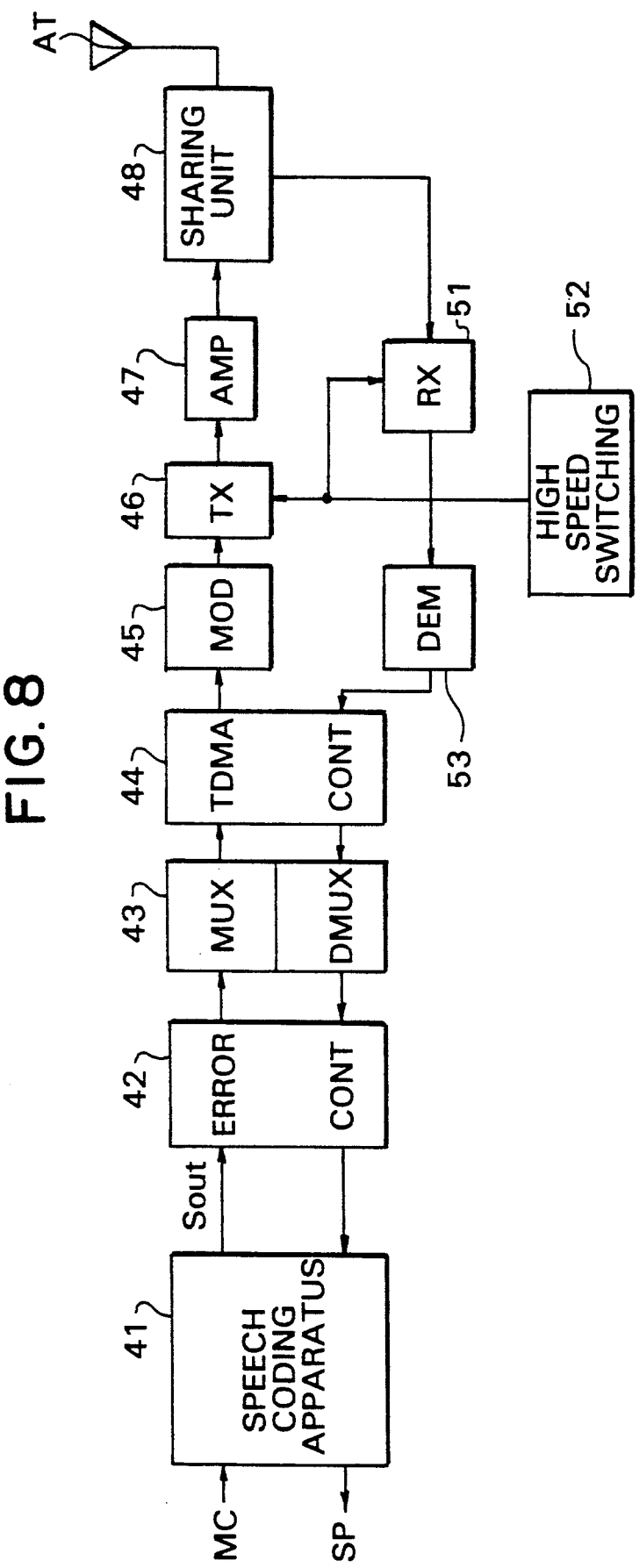
FIG. 8 is a block diagram showing an example of the application of the present invention.

FIG. 8 is a block diagram showing an example of the application of the present invention. It shows an example of application of the present invention to the transmitter and receiver side of a digital mobile radio communication system. In the figure, 41 is the speech coding apparatus of the present invention (receiver side has same construction as right half of FIG. 1). The coded output signal $S_{out}$ from the apparatus 41 is multiplexed through the error control unit 42 (demultiplexed on receiver side) and applied to a time division multiple access (TDMA) control unit 44. The carrier modulated by a modulator 45 is converted to a predetermined radio frequency by the transmitter 46, then amplified in power by a linear amplifier 47, and transmitted from an antenna AT through an antenna sharing unit 48.

The signal received from the other side goes from the antenna AT through the antenna sharing unit 48 and to the receiver 51 where it becomes an intermediate frequency signal. Note that the receiver 51 and the transmitter 46 are alternately active. For this, there is a high speed switching type synthesizer 52. The signal from the receiver 51 is demodulated by a demodulator 53 and made a base band signal.

The speech coding apparatus 41 is supplied with human speech caught by a microphone MC through an A/D converter (not shown) as the above-mentioned input speech signal S. On the other hand, the signal received from the receiver unit 51 finally becomes a reproduced speech (reproduced speech of FIG. 1) and is transmitted from the speaker SP.

As explained above, the present invention transforms the original code book 11 into a plurality of code book blocks 21-1, 21-2, . . . 21-n. Each block stores the divided signal vectors $C_1, C_2 \ldots$, determines the shape information of the head (first) divided signal vector then fixes the same, and finds the shape information for the next divided signal vector, then repeats this, while the same gain information is allocated to a plurality of shape information, so the ratio of the shape information and the gain information can be made the same value as in the conventional example. Therefore, it is possible to prevent deterioration of the quality of the reproduced signal on the receiver side.

Further, the code book blocks 21-1, 21-2, . . . 21-n have a dimension 1/nth of the dimension N as the code book 11, accordingly the number of patterns $2^M$ of the original code book 11 can be made $2^{M/n}$, so the required memory capacity can be remarkably reduced. Further, along with this, it is possible to remarkably reduce the amount of operations for pattern searching, so there is the advantage that it is possible to realize a vector quantization construction with inexpensive hardware.

We claim:

1. A speech coding apparatus receiving an input speech signal, comprising:

a code book storing a $N \times 2^M$ size signal vector group with $2^M$ indexes and a dimension of N, said code book including a number n of code book blocks, n being a positive integer greater than or equal to 2, each of the code book blocks including $2^{M/n}$ indexes and a dimension of N/n, each of the code book blocks corresponding to mutually different indexes and mutually different portions of the dimension N, and each of the code book blocks storing a $2^{M/n} \times N/n$ size group of divided signal vectors, where M and N are positive integers;

a multiplier unit, coupled to said code book, which reads out signal vectors successively from said code book and selectively multiplies the signal vectors by a gain to generate an output;

a prediction filter unit, coupled to said multiplier unit, which uses a given filter coefficient and performs a filter operation with respect to the output from said multiplier unit to generate a reproduced speech signal;

an error detection unit, coupled to said prediction filter unit, which receives as an input the reproduced speech signal from said prediction filter unit and the input speech signal, and obtains an error between the reproduced speech and input speech signals; and an evaluation unit, operatively connected to said error detection unit, which determines the index corresponding to the signal vector giving the smallest error.

2. A speech coding apparatus receiving an input speech signal, comprising:

a code book storing a $N \times 2^M$ size vector group with $2^M$ indexes and a dimension of N, said code book including a number n of code book blocks, n being a positive integer greater than or equal to 2, each of the code book blocks including $2^{M/n}$ indexes and a dimension of N/n, each of the code book blocks corresponding to mutually different indexes and mutually different portions of the dimension N, and each of the code book blocks storing a $2^{M/n} \times N/n$ size group of divided signal vectors, where M and N are positive integers;

a multiplier unit, coupled to said code book, which reads out signal vectors successively from said code book and multiplies the signal vectors by a gain to generate an output;

a prediction filter unit, coupled to said multiplier unit, which uses a given filter coefficient and performs a filter operation with respect to the output from said multiplier unit to generate a reproduced speech signal;

an error detection unit, coupled to said prediction filter unit, which receives as an input the reproduced speech signal from said prediction filter unit and the input speech signal and obtains an error between the reproduced speech and input speech signals;

an evaluation unit, coupled to said error detection unit, which determines the index corresponding to the signal vector giving the smallest error, said multiplier unit including n number of multipliers connected to corresponding n number of code book blocks;

said prediction filter unit including n number of prediction filters provided corresponding to said n number of multipliers;

said error detection unit including n number of error detectors which are provided corresponding to the said n number of prediction filter units and which output n number of errors; and said evaluation unit including n number of evaluators which receive as inputs the n number of errors and determine the divided signal vectors giving the smallest corresponding errors from the corresponding code book blocks.

3. An apparatus as set forth in claim 2, further comprising adding means for adding a first divided signal vector giving a first smallest error specified by a first evaluator to a second code book block, the first divided signal vector being used as a fixed input and a second evaluator specifies a second divided signal vector giving a second smallest error and the specified first divided signal vector and second divided signal vector being used as fixed inputs and a third evaluator specifies a third divided signal vector giving a third smallest error, and this operation being repeated for each of the fourth and later code book blocks.

4. An apparatus as set forth in claim 3, wherein the same gain is given for all of the n number of multipliers.

5. An apparatus as set forth in claim 2, wherein when a first divided signal vector giving a first smallest error is specified by a first evaluator, the first error is fixed and in that state a second divided signal vector giving a minimum second error obtained by adding that first error to a second error detector is specified by a second evaluator, the second error is fixed and in that state a third divided signal vector giving a minimum third error obtained by adding the second error to a third error detector is specified by a third evaluator, and a similar operation is repeated for the fourth and later code book blocks.

6. An apparatus as set forth in claim 5, wherein the same gain is given to all of the n number of multipliers.

7. An apparatus as set forth in claim 2, wherein, for each of the n number of code book blocks, index information expressing n number of indexes corresponding to each of the n number of divided signal vectors respectively giving n number of smallest errors;

filter coefficient information expressing the filter coefficients used in the n number of prediction filters; and multiplexing and transmission means for multiplexing and transmitting, to a speech decoding apparatus on the receiver side, gain information expressing a gain corresponding to the number of multipliers.

* * * * *